United States Patent [19]

Yorikane et al.

[11] Patent Number: 4,556,897

[45] Date of Patent: Dec. 3, 1985

[54] TITANIUM COATED ALUMINUM LEADS

[75] Inventors: Masaharu Yorikane; Noboru Ohseki, both of Tokyo, Japan

[73] Assignee: Nippon Electric Co., Ltd., Tokyo, Japan

[21] Appl. No.: 464,418

[22] Filed: Feb. 7, 1983

[30] Foreign Application Priority Data

Feb. 9, 1982 [JP] Japan .................... 57-19092

[51] Int. Cl.[4] ............................ H01L 23/50
[52] U.S. Cl. ............................. 357/71; 357/54; 357/67
[58] Field of Search .................. 357/67, 65, 71, 54

[56] References Cited

U.S. PATENT DOCUMENTS

| | | | |
|---|---|---|---|
| 3,668,484 | 6/1972 | Greig et al. | 357/71 S |
| 3,751,292 | 8/1973 | Kongable | 357/71 S |
| 3,936,865 | 2/1976 | Robinson | 357/71 P |
| 4,164,461 | 8/1979 | Schilling | 357/71 S |
| 4,289,834 | 9/1981 | Alcorn et al. | 357/71 |
| 4,352,239 | 10/1982 | Pierce | 357/67 |
| 4,386,116 | 5/1983 | Nair et al. | 357/71 |
| 4,398,335 | 8/1983 | Lehrer | 357/71 S |

OTHER PUBLICATIONS

Gniewek et al., "Titanium Overlay on Metallurgy", IBM Tech. Discl. Bull., vol. 13, No. 5, Oct. 1970, p. 1124.
Attardo et al., "Inhibition of Electromigration in Thin Films by Use of Preferred Orientation", IBM Tech. Discl. Bull., vol. 13, No. 12, May 1971, p. 3823.
Laibowitz et al., "Fabrication of Vias in a Multilayered Metallization in LSI Technology", IBM Tech. Discl. Bull., vol. 21, No. 12, May 1979, pp. 5051-5052.
Murarka et al., "Refractory Silicides of Titanium and Tantalum for Low-Resistivity Gates and Interconnects", IEEE Journal of Solid-State Circuits, vol. SC15, No. 4, Aug. 1980, pp. 474-482.
IEEE Journal of Solid-State Circuits, vol. SC-13, No. 5, Oct. 1978, "PSA-A New Approach for Bipolar LSI", by: Kenji Okada, Kunio Aomura, Masao Suzuki and Hiroshi Shiba.

Primary Examiner—William D. Larkins
Assistant Examiner—John Lamont
Attorney, Agent, or Firm—Laff, Whitesel, Conte & Saret

[57] ABSTRACT

A semiconductor device has a semiconductor substrate with a first insulating layer formed thereon. A first wiring includes a layer extending over the first insulating layer and a metallic film of refractory metal having high melting point disposed on the wiring layer. A contact hole is formed in the second insulating layer. Then, a second wiring, having the same material as the first wiring layer, is provided as an upper layer. The metallic film is removed inside the contact hole and the second wiring layer is directly connected to the first wiring layer. Aluminum, silicon, aluminum-silicon alloy, copper-aluminum alloy and the like can be used for the first and second wiring layers. The metallic film may be made of titanium, titanium nitride, molybdenum, tungsten, platinum, chromium or may be a composite film or alloy film of these metals. Further, alloys of above-mentioned high melting point materials may be used. The metallic film has the thickness of about 300 to 3,000 Å and preferably, 500 to 1,500 Å. Each of the wiring layers has a thickness of about 0.3 to 2.5 μm, and preferably, 0.8 to 1.8 μm.

2 Claims, 16 Drawing Figures

TITANIUM COATED ALUMINUM LEADS

BACKGROUND OF THE INVENTION

The present invention relates to a semiconductor device, and more particularly to a semiconductor integrated circuit device having a wiring including a wiring layer such as aluminium layer or silicon layer and a metallic film such as titanium film or platinum film deposited on the upper or bottom surface of the wiring layer.

Heretofore, in a semiconductor integrated circuit device, a metallic film of refractory metal having a high melting point is deposited on the upper surface of a wiring layer of aluminum. This film improves the corrosion resistance of the wiring layer, prevents a bulging of the wiring layer due to heat-treatment. Thus, the film prevents short-circuits between the wiring layers in multi-layered wiring. The metallic film is often deposited also on the lower surface of the wiring layer to improve the adhesion between the wiring layer and an insulating layer, therebelow. If the wiring layer includes a polycrystalline silicon, the metallic film of refractory metal is sometimes disposed on the upper surface of the wiring layer in order to reduce resistance of the wiring as a whole. Therefore, the metallic film of refractory metal is widely used in the wiring structure.

However, in this wiring structure, a contact failure problem, that is an open circuit problem, is likely to occur responsive to the flow of current at a contact portion which is used for connecting one wiring to the other wiring.

SUMMARY OF THE INVENTION

It is therefore an object of the present invention to provide a semiconductor device which eliminates all of the problems with the prior art described above and which provides as high reliability.

In accordance with the present invention, a semiconductor device comprises a semiconductor substrate, a first insulating layer formed on the semiconductor substrate. A first wiring layer of a first wiring means extends on the first insulating layer and a metallic film of refractory metal of the first wiring means having high melting point is disposed on the first wiring layer. A second insulating layer covers the first wiring. A contact hole is formed in the second insulating layer. A second wiring layer of a second wiring means is formed on the second insulating layer and used as an upper wiring layer made of the same material that is used to make. The first wiring layer, the metallic film is removed inside the contact hole and the second wiring layer is directly connected to the first wiring layer.

In accordance with the present invention, the semiconductor device has the second wiring included the second wiring layer and the metallic film of refractory metal below the second wiring layer. The metallic film of the second wiring means is not provided inside the contact hole.

Aluminum, silicon, aluminum-silicon alloy, copper-aluminum alloy and the like can be used for the first and second wiring layers. The metallic film may be made of titanium, titanium nitride, molybdenum, tungsten, platinum, chromium or may be a composite film or an alloy film of these metals. Further, it may be an alloy film made of the wiring layer and the above-mentioned high melting point materials. The metallic film has the thickness of, preferably, 300 to 3,000 Å and most preferably, 500 to 1,500 Å. Each of the first and second wiring layers has the thickness of, preferably 0.3 to 2.5 $\mu$m, and most preferably, 0.8 to 1.8 $\mu$m.

In order to obtain a highly reliable contact structure and to accomplish a high integration density, in accordance with the present invention, the contact hole has a planar shape of either a square having the side of, preferably, 0.5 to 15 $\mu$m and most preferably, from 1.0 to 10 $\mu$m, or a circle having the diameter of, preferably, 0.5 to 15 $\mu$m and most preferably 1.0 to 10 $\mu$m.

BRIEF DESCRIPTION OF THE DRAWINGS

FIGS. 3A and 3B are cross-sectional views of the test samples used for testing the effect of the present invention, wherein FIG. 3A shows the structure of the prior art device and FIG. 3B shows the structure of the present invention;

DESCRIPTION OF THE PREFERRED EMBODIMENTS (Description of the Prior Art)

Figure 1:
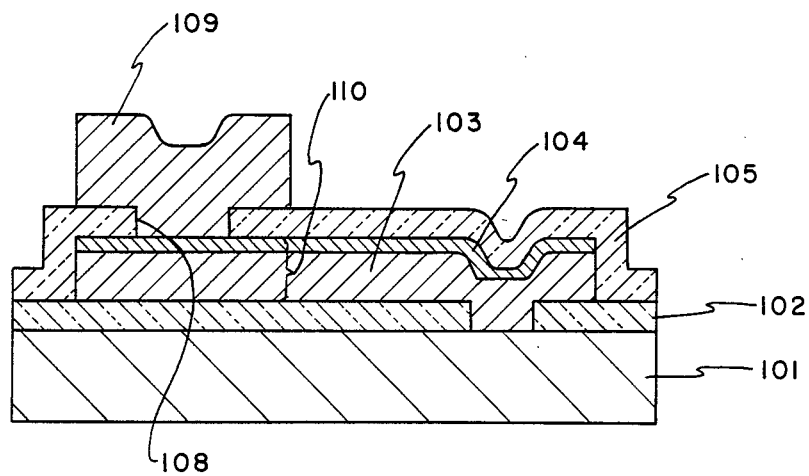
FIGS. 1 and 2 are cross-sectional views showing the semiconductor devices of the prior art.

In the semiconductor device of the prior art shown in FIG. 1, a first insulating layer 102 is formed on the major surface of a semiconductor substrate 101 and a first wiring means 110 extends over the first insulating layer 102. The first wiring means 110 includes a first wiring layer 103 made of aluminum formed directly on the first insulating layer 102 connecting to a part of the semiconductor substrate 101. First wiring means 110 also includes a metallic film 104 of titanium deposited over the entire upper surface of the first wiring layer 103. A second insulating layer 105 covers the first wiring means 110, and a contact hole 108 is formed in this second insulating layer 105. An electrode 109 is part of a second wiring layer made of aluminum which is formed in the contact hole 108 and on the second insulating layer 105 in the vicinity of the contact hole. Electrode 109 electrically connects to the first wiring 110 through this contact hole 108. In this case, the electrode 109 is not in direct electrical contact with the first wiring layer 103, but is in contact with the metallic film 104 of refractory metal, as depicted in FIG. 1.

Figure 2:
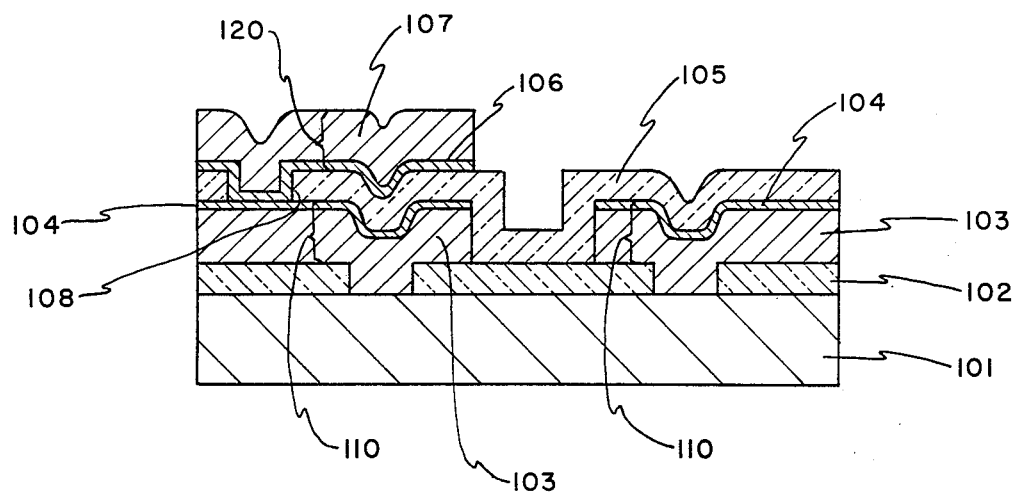

In the semiconductor device of the prior art shown in FIG. 2, on the other hand, a second wiring means 120 comprises a second wiring layer 107 of aluminum and a metallic film 106 of titanium formed under the second wiring layer 107. The first and second wiring layers function as the main wiring passages and make contact at the contact portion 108 via the metallic films 104 and 106 of refractory metal. Incidentally, the same reference numerals are used in FIG. 2 to identify the constituents shown in FIG. 1.

In the prior art devices described above, an open contact defect occurs frequently at the contact portion when there is a relatively large current flow between both wirings via the contact portion, or, when a current flow causes electromigration in each wiring layer. For this reason, a semiconductor device having high reliability can not be obtained.

The inventor investigated the open failure in these contact portions and found the occurrence of hillocks and voids of aluminum. It is believed that this phenomenon occurs as the flow of the atomic migration in the wiring passage of aluminum becomes discontinuous due to the presence of the metallic film of refractory metal at the contact portion.

Accordingly, the principle of the present invention is that if the migration of the aluminum atoms is made continuous by directly connecting the first and second wiring layers, the hillocks and voids would not occur at the contact portion. Hence, the contact portion would not become either an open circuit or a defect such as an extremely large resistance.

(Evaluation of Reliability)

Figure 3A:
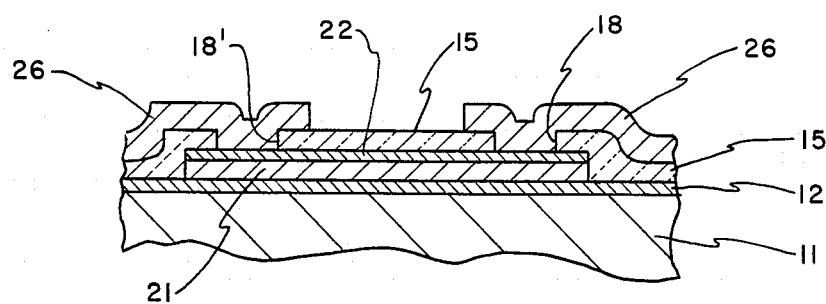
Figure 3B:
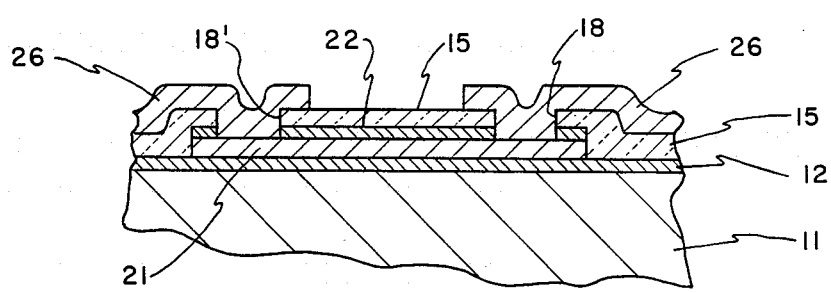

The inventor prepared the two kinds of test samples shown in FIGS. 3A and 3B and examined the relationship between the life of the wiring (MTFF: Mean Time To Failure) and the testing temperature. In the sample shown in FIG. 3A, a thick first wiring layer 21 of aluminum of 1.0 $\mu$m thickness is deposited on a silicon substrate 11 via a silicon dioxide layer 12. A titanium film 22 of 0.1 $\mu$m thickness is disposed over the entire surface of the first wiring layer 21. A silicon nitride film 15 of 1.0 $\mu$m thickness is prepared by vapor growth and then is deposited on the first wiring including the aluminum layer 21 and the titanium film 22. Contact holes 18, 18' are further formed. A second wiring of 1.5 $\mu$m thick aluminum layer 26 is in direct contact with the titanium film 22 through the contact holes 18, 18'. In the test sample shown in FIG. 3B, the reference numerals that are the same as those used in FIG. 3A represent the same constituents, having the same material and the same thickness. This test sample is different from that of FIG. 3A in that the titanium film 22 of the first wiring is removed inside the contact holes 18, 18' and an aluminum layer 26 as the second wiring is directly connected to the aluminum layer 21 of the first wiring.

The width of the first aluminum layer 21 and the titanium film 22 is 8 $\mu$m. The gap between the contact holes 18 and 18' is 500 $\mu$m. The planar shape of each contact hole is a square having a side of 4 $\mu$m for each of these test samples.

Figure 4:
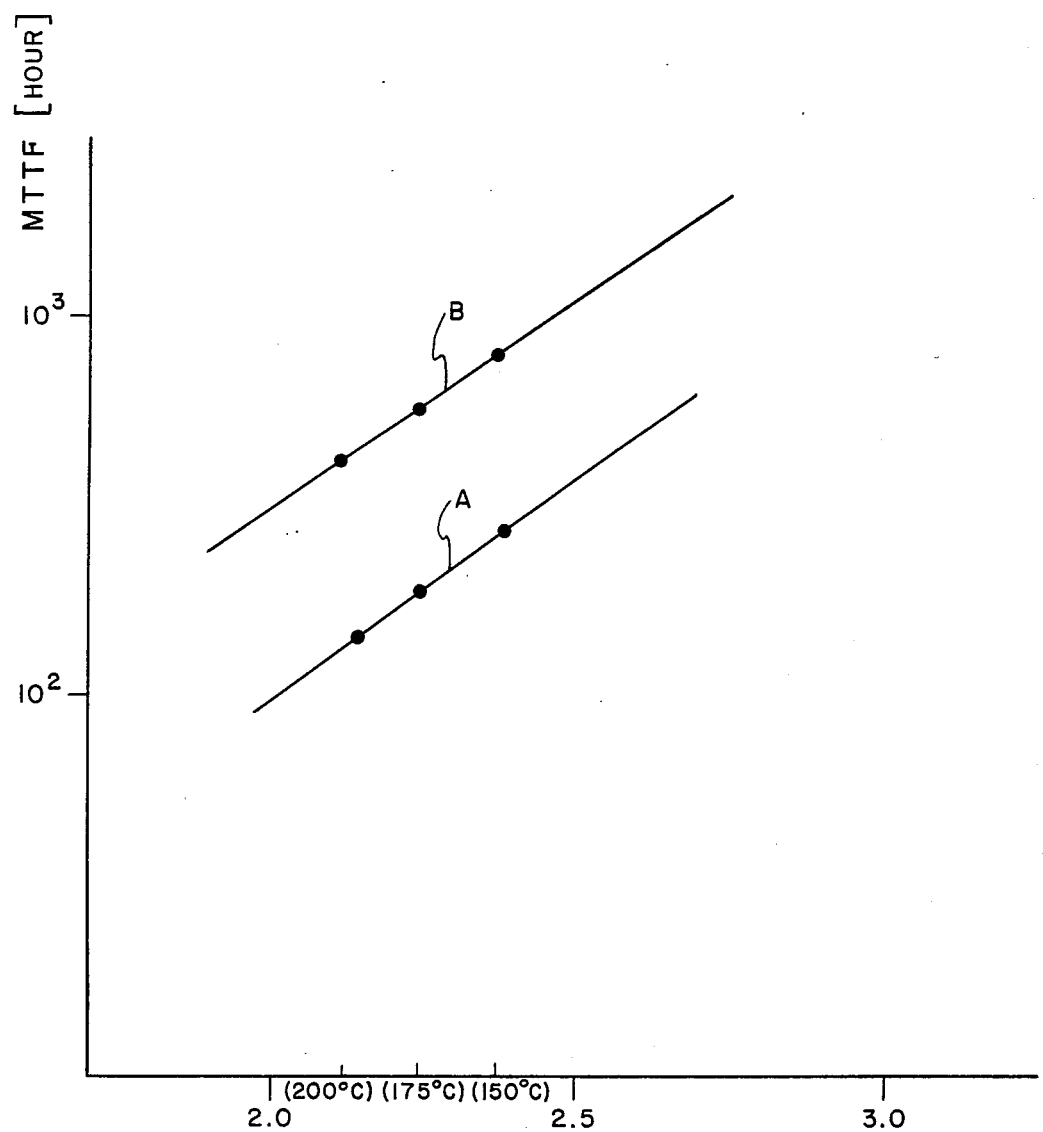
FIG. 4 is a diagram showing the results of the reliability tests on the structure of the prior art and of the present invention, wherein data A and B correspond to the structures of FIGS. 3A and 3B, respectively.

Applicant prepared 100 samples for each test and used a current having a current density of $2 \times 10^6$ A/cm$^2$ (at the first wiring), which is larger than the current density of the actual semiconductor device. The current is caused to flow through a passage from the second wiring—contact portion at contact hole 18—first wiring—and contact portion at contact hole 18'—to the second wiring. While the current is being caused to flow, the life test of the wiring is carried out by changing the ambient temperature to 150° C., 175° C. and 200° C. The results are shown in FIG. 4. As can be seen from the diagram, the data A of the sample of FIG. 3A is worse than the data B of the sample of FIG. 3B.

It can be thus understood that if the titanium films 104, 106 which are used as the metallic film of refractory metal are removed from the contact portion 108 in the semiconductor devices shown in FIGS. 1 and 2, respectively, the reliability of the devices can be improved.

(Description of Embodiments)

Figure 5A:
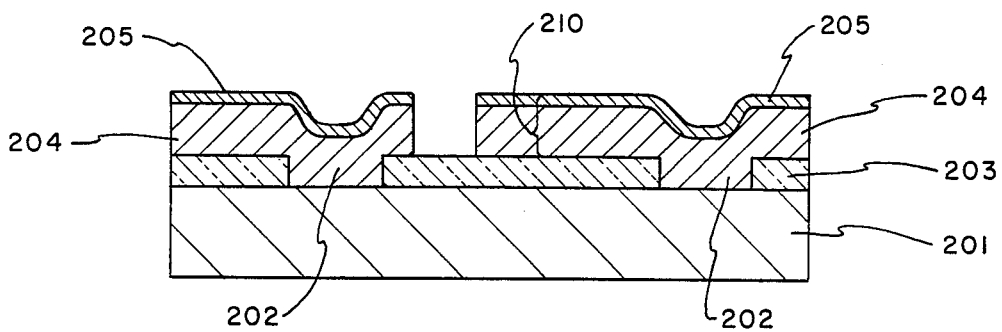
FIGS. 5A through 5C are cross-sectional views showing successive steps in the fabrication process of the first embodiment of the present invention.
Figure 5B:
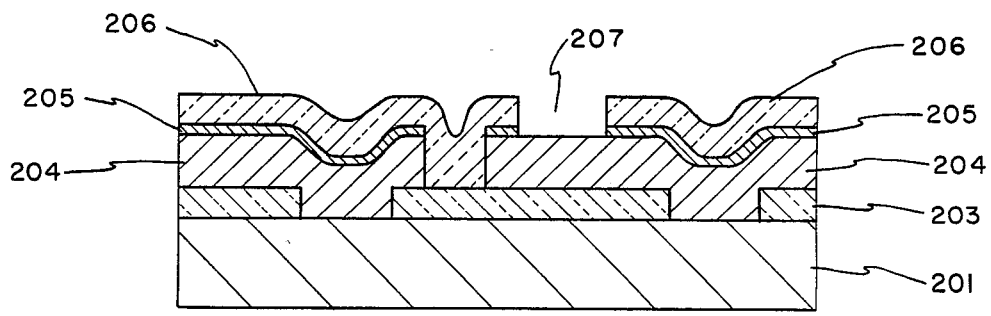
Figure 5C:
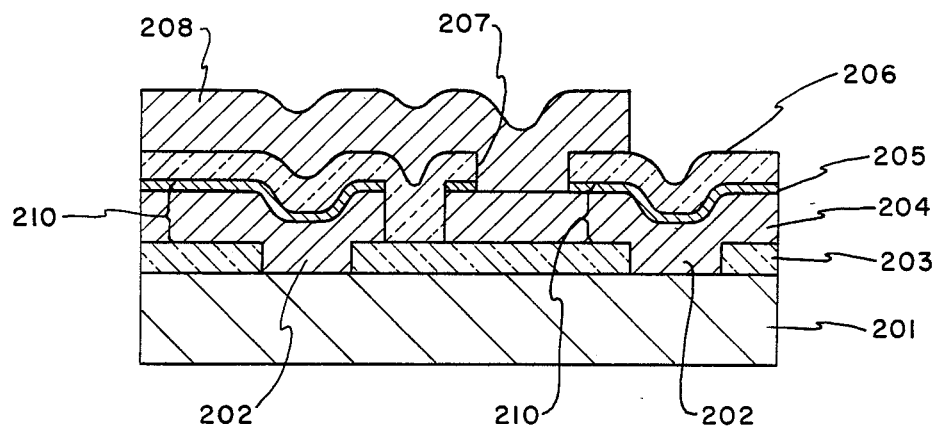

First Embodiment (FIGS. 5A, 5B, 5C)

An electrically insulating layer such as a silicon oxide layer 203 is formed on the surface of a silicon substrate 201 in which circuit elements (not shown) are formed in a customary manner. Openings 202 are formed in the layer 203. Next, the first wiring means 210 is formed by use of two kinds of metals, i.e., an aluminum layer 204 of 1.0 $\mu$m thickness is the principal electrode wiring metal and a titanium film 205 of 0.1 $\mu$m thickness is the metallic film of refractory metal. Film 205 is disposed on the upper surface of layer 204. (See: FIG. 5A).

After another electrically insulating layer 206, such as a silicon nitride layer of 1.0 $\mu$m thickness, is deposited on the silicon substrate 201 including the first wiring 210, a contact hole 207 of a square planar shape having one side of 4 $\mu$m is formed on the silicon nitride film 206. The titanium film 205 inside the contact hole 207 is removed to expose the aluminum layer 204 of the first wiring layer. (See: FIG. 5B).

Figure 6:
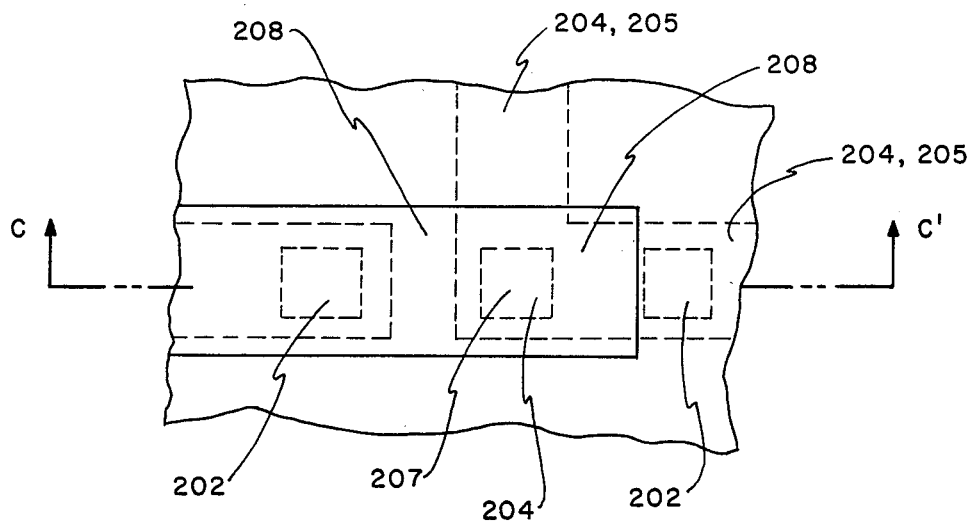
FIG. 6 is a plan view of the structure of FIG. 5C, which in turn is a cross-sectional view taken along line C—C' of FIG. 6, when viewed in the direction indicated by the arrows.

A second wiring is formed using an aluminum layer 208, for example. (See: FIGS. 5C and 6). The first and second wirings are 6.5 $\mu$m wide and 8 $\mu$m wide, respectively.

As described above, the titanium film 205 is deposited on the upper surface of the first wiring layer except where it has been removed from the contact hole 207. No metal which is from the aluminum layer 204 exists on the surface of the contact hole 207. Thus the causes for unstability at the contact portion due to the feed of a current is eliminated.

Figure 7:
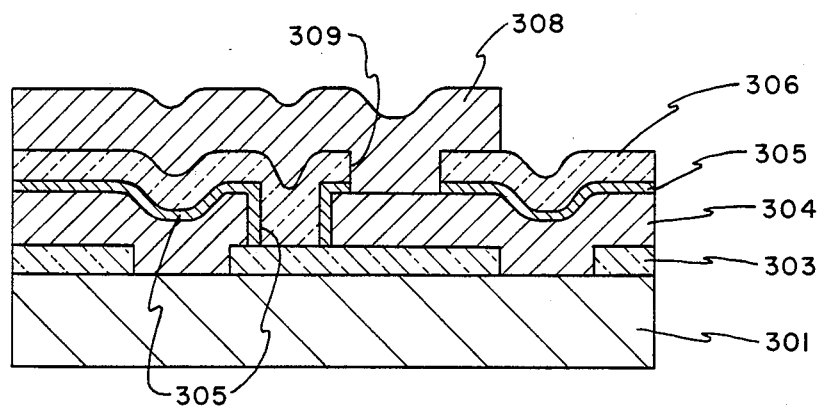
FIGS. 7, 8 and 9 are cross-sectional views of the second, third and fourth embodiments of the present invention, respectively.

Second Embodiment (FIG. 7)

In the first wiring means of the first embodiment described above, no metallic film of refractory metal is disposed on the side surface of the first wiring layer, but the metallic film may be disposed on the side surface as shown in FIG. 7. The metallic film may also be disposed on the side surface of the first wiring layer to improve corrosion resistance.

In other words, as shown in FIG. 7, an aluminum layer 304 is disposed on a silicon oxide film 303 formed on the silicon substrate 301. A titanium film 305 is formed on the upper surface of the aluminum layer 304 and also on the side surface of this aluminum layer 304. An upper aluminum wiring 308 is directly connected to a lower aluminum layer 304 through a contact hole 309 of the silicon nitride film 306.

Figure 8:
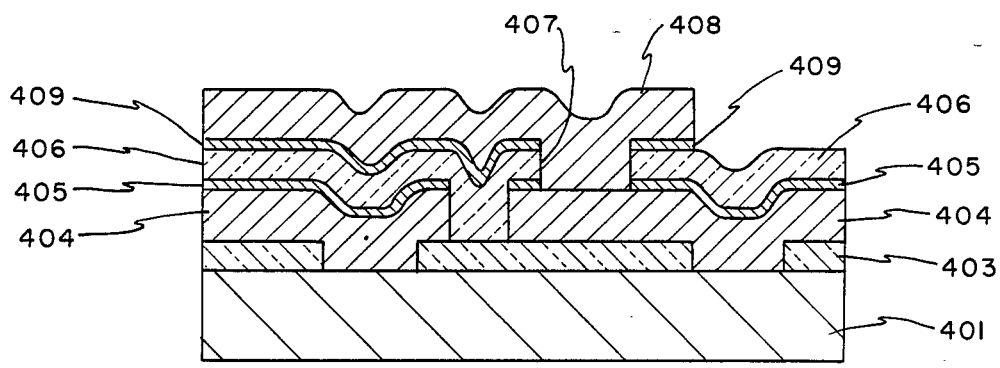
Figure 9:
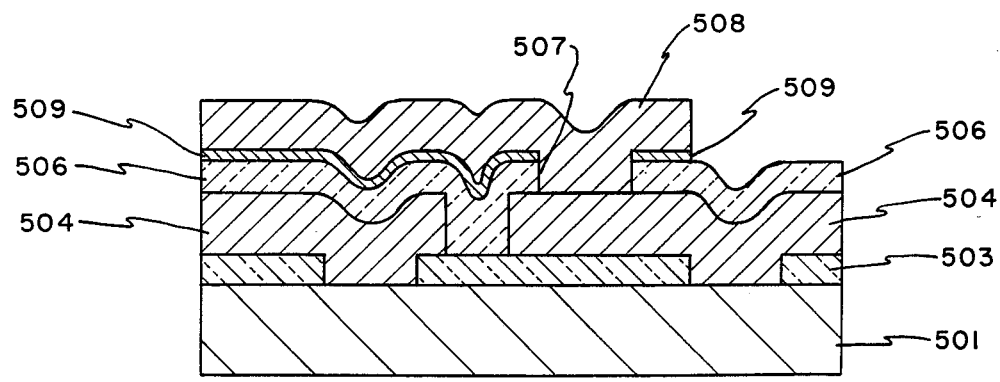

Third and Fourth Embodiments (FIGS. 8, 9)

A titanium film is disposed under the lower surface of a second wiring layer of a second wiring means as shown in FIGS. 8 and 9, respectively. The titanium films 409 and 509 inside the contact holes 407 and 507 is removed to directly connect the aluminum of the first and second wirings to each other. In other words, each of the silicon oxide films 403 and 503, has an opening, and is formed on the silicon substrates 401 and 501, respectively. Aluminum wirings 404 and 504 of the first wiring means are formed on the silicon oxide films, respectively. In only FIG. 8, the titanium film 405 is disposed on the aluminum wiring 404. Titanium films 409 and 509 are disposed below the aluminum wiring layers 408 and 508 of the second wirings, respectively. However, the titanium films 409 and 509 also 405 do not exist at the contact portion where aluminum wiring layer 405, 505 of the second wiring means is connected to the aluminum wiring layer of the first wiring means through the contact holes of the silicon nitride film 406, 506.

Fifth Embodiment (FIGS. 10A, 10B, 10C, 10D)

This embodiment illustrates the application of the present invention to a two-layered polycrystalline silicon wiring layer in accordance with the PSA (polysilicon self-aligned) process. The PSA process is described in detail in "IEEE Journal of Solid State Circuits", Vol. SC-13, No. 5, October, 1978, p.p. 693-698.

Figure 10A:
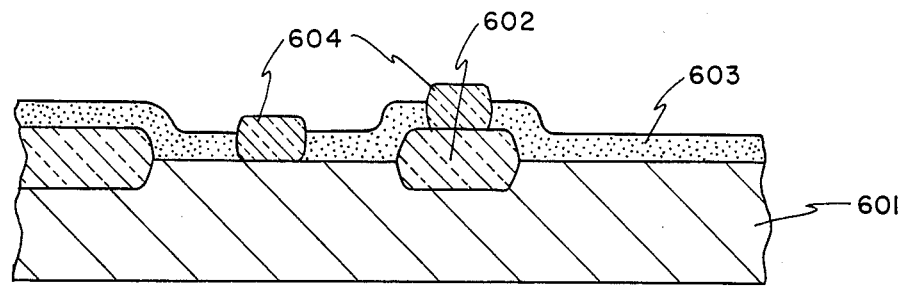
FIGS. 10A through 10D are cross-sectional views showing the manufacturing steps of the fabrication process of the fifth embodiment of the present invention.

First, P- and N-type impurity regions (not shown) and a field silicon oxide film 602 are formed on a silicon substrate 601 in accordance with customary diffusion, ion injection, oxidation techniques. After polycrystalline silicon 603 is deposited, it is selectively converted to a silicon oxide film 604. A desired P- or N-type impurity is then added to a predetermined region of polycrystallline silicon 603. (See: FIG. 10A).

Platinum is deposited on the surface of the silicon substrate 601 including polycrystalline silicon 603, followed by a heat-treatment to form platinum silicide 605 as the metallic film of refractory metal having a high melting point on the surface of polycrystalline silicon 603. Instead of this platinum silicide 605, tungsten may be selectively vapor-grown on the surface of polycrystalline silicon 603.

Figure 10B:
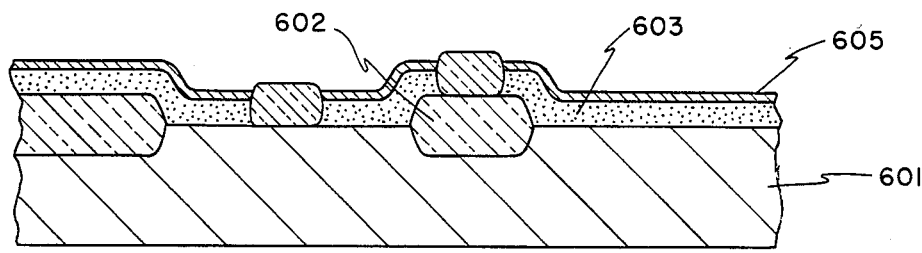

The thickness of platinum silicide 605 is preferably from 500 to 3,000 Å and is approximately 1,000 Å for practical applications. (See: FIG. 10B).

Figure 10C:
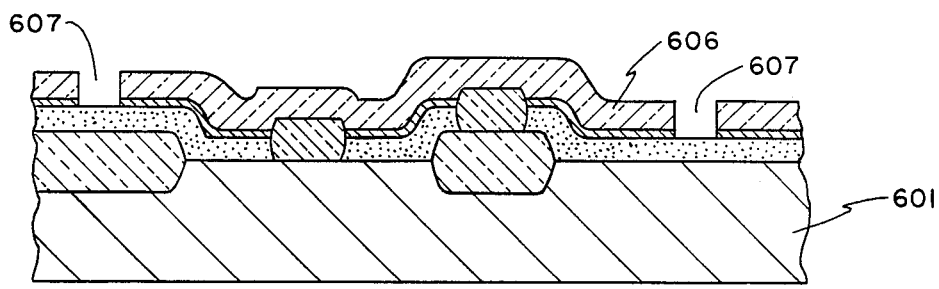
Figure 10D:
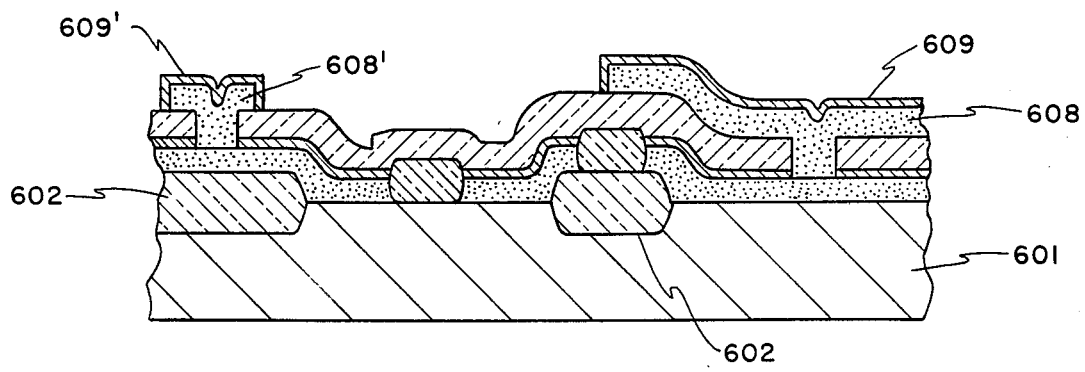

Next, a silicon nitride film 606 is deposited as the electrically insulating film. After the contact holes 607 are formed, platinum silicide 605 is removed inside these contact holes 607. Preferably, each contact hole 607 has a planar shape of a square having one side of approximately 1 to 10 μm and a practically preferred length of one side is approximately 4 μm. (See: FIG. 10C).

After polycrystalline silicon is deposited, selective etching is effected to form a second polycrystalline silicon layer as the second wiring 608 including an electrode 608'. An impurity is added to these polycrystalline silicon wiring layer 608, 608'. It is preferred to deposit a metal 609, 609' on the surface so as to reduce resistance.

Although the present invention has been described with reference to the preferred embodiments thereof, it is to be noted that the gist of the present invention resides in that in a wiring having a metallic film of refractory metal is disposed on the upper or lower surface of a principal wiring material. The present invention lets only the principal wiring material participate in the mutual conduction between the wiring layers so as to eliminate any unstability factors that would otherwise occur due to the passage of a current flowing through a junction between metals of different kinds. Thus, a semiconductor integrated circuit device has an improved reliability.

It can be understood further that the present invention can be applied not only to the silicon semiconductor integrated circuit devices but also to all the integrated circuit devices having wiring layers of semiconductor compounds and other materials.

What is claimed is:

1. A semiconductor device comprising a semiconductor substrate, a silicon oxide film formed on a major surface of said substrate and having a first aperture reaching a part of said substrate, a first wiring comprising a first aluminum layer formed on said silicon oxide film and connected through said first aperture to said part of said substrate and a titanium film provided on an upper surface of said first aluminum layer except on a contact portion of said first aluminum layer, said titanium film being also provided on a side surface of said first aluminum layer, a silicon nitride film covering said first wiring and having a second aperture reaching said first aluminum layer and exposing said contact portion of first aluminum layer, and a second wiring of a second aluminum layer provided on said silicon nitride film and connected directly to said contact portion of said first aluminum layer of said first wiring.

2. A semiconductor device comprising a semiconductor substrate, a silicon oxide film formed on a major surface of said substrate and having a first aperture reaching a part of said substrate, a first aluminum layer provided on said silicon oxide film and being connected through said first aperture to said part of said substrate, a silicon nitride film covering said first aluminum layer with a second aperture reaching a contact portion of said first aluminum layer, a second aluminum layer provided on said silicon nitride film and being directly connected through said second aperture to said first aluminum layer, a first titanium film disposed between substantially the entire upper surface of said first aluminum layer and said silicon nitride film except at said second aperture, and a second titanium film disposed between substantially the entire lower surface of said second aluminum layer and said silicon nitride film except said second aperture.

* * * * *